(12) United States Patent
Helzer

(10) Patent No.: US 7,418,616 B2
(45) Date of Patent: Aug. 26, 2008

(54) SYSTEM AND METHOD FOR IMPROVED SYNCHRONOUS DATA ACCESS

(75) Inventor: Amir Helzer, Nesher (IL)

(73) Assignee: Brooktree Broadband Holding, Inc., Newport Beach, CA (US)

( * ) Notice: Subject to any disclaimer, the term of this patent is extended or adjusted under 35 U.S.C. 154(b) by 1155 days.

(21) Appl. No.: 10/064,445

(22) Filed: Jul. 15, 2002

(65) Prior Publication Data

US 2004/0008730 A1     Jan. 15, 2004

(51) Int. Cl.
*G06F 1/04* (2006.01)
(52) U.S. Cl. .................................. 713/503; 713/401
(58) Field of Classification Search ................. 713/503, 713/401
See application file for complete search history.

(56) References Cited

U.S. PATENT DOCUMENTS

| | | |
|---|---|---|
| 5,448,715 A | 9/1995 | Lelm et al. |
| 5,479,647 A | 12/1995 | Harness et al. |
| 5,555,524 A | 9/1996 | Castellano |
| 5,572,722 A | 11/1996 | Vogley |
| 5,577,236 A | 11/1996 | Johnson et al. |
| 5,608,896 A | 3/1997 | Vogley |

(Continued)

OTHER PUBLICATIONS

International Search Report dated Jan. 22, 2004 for Application No. PCT/US03/21791.

*Primary Examiner*—Thuan N Du
(74) *Attorney, Agent, or Firm*—Thomas, Kayden, Horstemeyer & Risley, LLP

(57) ABSTRACT

A system and method for improved synchronous access of stored data are provided herein. A data requestor transmits a clock signal and a read request signal for reception by a data source, whereupon skewed versions of the clock signal and the read request signal are received due to the delays in the signal paths between the data requestor and the data source. Accordingly, the data requestor provides skewed clock and read request signals to its input sampling module to simulate the delays of the signal paths. Additionally, the data requestor provides process information associated with the requested data to a dual clock first in-first out (FIFO) buffer. When the input sampling module detects a read request using the skewed read request signal, the input sampling module can use this signal and the skewed clock signal to sample a data signal from the data source to obtain the requested data. Concurrently, the input sampling module can access the process information from the dual clock FIFO buffer using the skewed clock signal. Based at least in part on this process information, one or more process operations can be performed on the requested data. In other implementations, the storage and subsequent access of process information from a dual-clock FIFO is omitted. The present invention finds particular benefit in accessing data stored in synchronous memory, such as synchronous dynamic random access memory (SDRAM) and synchronous static random access memory (SSRAM).

48 Claims, 4 Drawing Sheets

U.S. PATENT DOCUMENTS

| | | |
|---|---|---|
| 5,630,096 A | 5/1997 | Zuravleff et al. |
| 5,696,951 A | 12/1997 | Miller |
| 5,809,521 A | 9/1998 | Steinmetz et al. |
| 5,818,890 A * | 10/1998 | Ford et al. .................. 375/371 |
| 5,857,095 A | 1/1999 | Jeddeloh et al. |
| 5,870,446 A * | 2/1999 | Mc Mahan et al. .......... 375/371 |
| 5,978,284 A | 11/1999 | Powlowski |
| 6,128,678 A | 10/2000 | Masteller |
| 6,128,748 A | 10/2000 | MacWilliams et al. |
| 6,131,149 A | 10/2000 | Lu et al. |
| 6,150,866 A | 11/2000 | Eto et al. |
| 6,178,518 B1 | 1/2001 | Toda |
| 6,226,757 B1 | 5/2001 | Ware et al. |
| 6,292,903 B1 * | 9/2001 | Coteus et al. ............... 713/401 |
| 6,311,234 B1 | 10/2001 | Seshan et al. |
| 6,321,343 B1 | 11/2001 | Toda |
| 6,330,650 B1 | 12/2001 | Toda et al. |
| 6,330,651 B1 | 12/2001 | Kawaguchi et al. |
| 6,333,896 B1 | 12/2001 | Lee |
| 2002/0031042 A1 | 3/2002 | Kim et al. |
| 2002/0040446 A1 | 4/2002 | Doblar et al. |

* cited by examiner

SYSTEM AND METHOD FOR IMPROVED SYNCHRONOUS DATA ACCESS

BACKGROUND OF THE INVENTION

The present invention relates generally to accessing data from a synchronous data source and more particularly to compensating for skew in signal paths to and from a synchronous data source.

A major concern in the design and manufacture of electronic devices is the latency, or skew, between the transmission and reception of a signal resulting from the physical characteristics of the device and/or the transmission medium. Skew is of particular concern in the development of synchronized systems utilizing a common clock signal. Skew in the clock signal paths, the data signal paths, and/or the control signal paths in synchronized systems, if significant and/or variable, can result in an erroneous operation of the synchronous system. To illustrate, known synchronous memory access systems typically include a memory controller utilized to read data from a synchronous memory device, such as a synchronized dynamic random access memory (SDRAM). To access data from the memory matrix of the synchronous memory device, the memory controller typically provides address and control information generated by a command generation module to the memory matrix via a control path that generally includes an off-chip driver (OCD), an address/control interconnect, and an input receiver (IR). Likewise, a clock signal generated by a clock generator (denoted as an original clock signal) is provided via a clock signal path that typically includes an OCD, a clock interconnect, and an IR. Based on the address/control information, the memory device retrieves the requested stored data from the memory matrix and provides a data signal representative of the stored data to an input sampling module of the memory controller via a data path that generally includes an OCD, a data interconnect, and an IR. The input sampling module samples the data signal using the original clock signal to latch the stored data, processes the data as appropriate, and then provides the data to its appropriate destination.

Synchronous memory devices, such as the above memory device, often are implemented to minimize or avoid the overhead (e.g., handshaking and wait-states) common to asynchronous devices. By using a common clock signal and a predetermined memory access latency, the memory controllers generally can send a request for data to a memory device and then sample the output from the memory device after a predetermined number of clock cycles to obtain the stored data from the memory device. For example, assume that the time between the receipt of a read request by the memory device and the output of the requested data by the memory device is one clock cycle (this time herein referred to as the memory access latency). The input sampling module, knowing that the requested data will be on the data interconnect no later than one cycle after a read request is transmitted, can sample the data signal on the data interconnect at the next rising edge (i.e., one cycle later) to obtain the requested data from the memory device.

However, it will be appreciated that the skew in the signal paths of many such systems can be relatively large and/or can vary greatly compared to the clock signal period. In addition to on-chip delays, skew can result from, for example, the operation of off-chip drivers (OCDs) that are used to drive their respective signals on interconnects to input receivers (IRs). Further, skew may result from the transmission of electrical signals over the physical mediums (e.g., printed circuit board (PCB) traces) of the interconnects. Delays introduced by an OCD, an IR, and an interconnect are herein referred to as $t_{OCD}$, $t_{IR}$ and $t_{PCB}$, respectively.

Although the delays resulting from each of the OCDs, IRs, and interconnects sometimes are not large enough to individually affect the operation of the input sampling module of the memory controller, the sum of their delays often can result in timing problems, thereby resulting in sampling errors, even at relatively slow clocking frequencies. Likewise, although the variance in the delay of each of the OCDs, IRs, and interconnects may be relatively insignificant, the resulting combination of variances of the elements of a signal path also can result in sampling errors.

To illustrate, assume that the original clock signal is transmitted over the clock signal path (i.e., an OCD, a clock interconnect, and an IR) in the known system described above. Accordingly, the skew ($t_{skew}$) between the original clock signal generated by the clock generator and the clock signal received by the memory matrix is substantially equivalent to the sum of the individual delays of the OCD, the IR, and the clock interconnect, or $t_{skew}=t_{OCD}+t_{IR}+t_{PBC}$. If this sum ($t_{skew}$) has a possible range that exceeds the clock cycle time or varies considerably during operation, the input sampling module of the memory controller typically cannot reliably know at which clock edge to sample the data signal from the memory device.

Accordingly, the cycle time of the original clock signal often is enlarged to minimize or prevent unreliable signal sampling by the input sampling module. Different memory systems have different associated delays. For example, a DDR SDRAM memory has an internal delay lock loop (DLL) compensating for its IR and OCD delay. When using such memory, the uncompensated delays result from the OCD of the memory controller, the clock signal transmission time over the clock interconnect, data signal transmission time over the data interconnect, and the memory controller's IR delay. For such systems, when using a single synchronous clock, the clock cycle time (T) must be greater than the sum of the above elements (i.e., $T>t_{OCD}+t_{IR}+2t_{PCB}$). Of course, in order to guarantee reliable operation other factors should also be taken into account when doing the time budgeting, such as clock period uncertainty, PCB related jitter, setup requirements, etc.

Another important factor to be considered is the difference between clock and data loading. A clock signal typically goes to all memory devices. The data lines are typically less loaded than the clock line, because several thin memory components can be used to assemble a wide memory system. In high-speed memories, the data lines are usually point-to-point, whereas the clock net is loaded by several memory devices. Therefore, the uncertainty in the OCD delay and interconnect transmission line for the data lines typically is smaller than the uncertainty for the clock line (also for the control lines). For stub series terminated logic (SSTL) class II drivers (one example of an OCD), the $t_{OCD}$ typically can vary between 0.5 nanosecond (nS) and 3 nS, whereas the $t_{IR}$ value for SSTL class II inputs (one example of an IR) can range from 0.1 nS to 0.9 nS. Likewise, PCB traces (one example of an interconnect) typically have a $t_{PCB}$ value that ranges between 75 picoseconds (pS) and 500 pS for lengths from one-half inch to three inches. Using these exemplary values, the value of ($t_{OCD}+t_{IR}+2t_{PCB}$) can vary from between 0.75 nS to 4.9 nS. Adding additional factors that contribute to timing uncertainty such as setup requirements, clock jitter, etc., having a total of 1 nS, the minimum cycle time for the original clock signal, in this example, is at least 5.9 nS, corresponding to a maximum clock frequency of about 170 megahertz (MHz). Since the system clock frequency of many types of computing systems, such as communication and graphics systems, exceeds this 170 MHz limit, a different approach to using synchronous memories is desirable.

Accordingly, mechanisms attempting to compensate for the effects of skew while preserving high clock frequencies have been developed, a number of which are discussed below. One known implementation for minimizing the effects of skew utilizes a clock generator that is external to both the memory device and the memory controller. In this case, the clock generator provides an original clock signal to both the memory device and the memory controller. In the event that the delay in the signal path between the clock generator and the memory controller is substantially equivalent to the delay in the signal path between the clock generator and the memory controller, the memory device and the memory controller typically would be synchronized to the same clock signal, effectively negating the OCD, IR, and interconnect delays of the clock signal path. However, these same delays exist in the address/control path and the read data path, thereby causing timing errors at the memory device due to the relative skew between the address/control/read signals and the common clock signal. As a result, uncertainty is introduced in the sampling of the control and/or address signals by the memory device as a result of varying or unknown skew in the control/address signals. Likewise, variable and/or unknown skew in the read data path between the memory device and the memory controller also introduces uncertainty in the sampling of read data from the memory device by the memory controller.

Another known system for minimizing the effects of skew implements a phase lock loop (PLL) and an additional IR. In this known implementation, the original clock signal from the clock generator of the memory controller is provided to the PLL as a reference clock signal and the output clock signal to the memory is supplied as feedback to the PLL via a signal path that simulates the clock signal path between the memory controller and the memory device.

Using this feedback clock signal, the PLL typically attempts to ensure that the phase of the skewed clock signal used by the memory device and the original clock signal used by the input sampling module are the same by providing a corrected clock signal, effectively negating the OCD, IR, and interconnect delays for the clock signal path. However, as with the above known implementation, delays still exist in the address/control path and the read data path, thereby causing timing errors at the memory device due to the relative skew between the address/control/read signals and the corrected clock signal. Advancing the clock frequency by the OCD, IR, and interconnect delays to compensate for the relative skew typically fails since the sampling timing at the input of the memory device then is misadjusted, as are the address and control signals, resulting in uncertainty in sampling of the address and/or control signals.

Yet another known implementation utilizes resampling in an attempt to overcome problems resulting from clock skew. In this case, the memory controller of the known system typically includes a resampling module to resample the output from the input sampling module of the memory controller using the original clock signal. As with the above known implementation, an additional IR generally is utilized to provide a skewed clock signal to the input sampling module that is substantially equivalent to the skewed clock signal received by the memory device. Accordingly, the input sampling module can more reliably sample the data signal provided by the memory device using the skewed clock signal (disregarding the delays introduced over the data signal path).

While the data can be more reliably sampled by the input sampling module using the skewed clock signal, it will be appreciated, however, that the data is sampled in the skewed clock domain rather than in the original clock domain used by the remainder of the memory controller. Accordingly, known solutions implement the resampling module to resample the once-sampled data to convert the data from the skewed clock domain to the original clock domain using the original clock signal as the timing reference. While this generally is successful when the signal delays and/or variance are relatively minor, the resampling module experiences the same unreliable sampling issues when the control signal delays are as great or greater than the time period of the clock signal due to the inherent delays in the control signal path, since it may be unclear as to which read command a set of sampled data is associated. When this delay is relatively significant, it can affect the timing of the resampling module and, therefore, cause any resampled data to be unreliable.

Accordingly, a system and a method for improved synchronization during a data access from a synchronous data source would be advantageous.

SUMMARY OF THE INVENTION

The present invention mitigates or solves the above-identified limitations in known solutions, as well as other unspecified deficiencies in known solutions. A number of advantages associated with the present invention are readily evident to those skilled in the art, including economy of design and resources, greater system performance, flexibility, cost savings, etc.

In accordance with one embodiment of the present invention, a data requestor for obtaining requested data from a synchronous data source is provided, wherein the data requestor transmits for reception by the data source an original clock signal and an original control signal, which is representative of a data request, and the data source receives a delayed version of the original clock signal resulting from a delay in a clock signal path between the data requestor and the data source and a delayed version of the original control signal resulting from a delay in a control signal path between the data requestor and the data source. The data requestor comprises a skewed clock signal generator adapted to generate a skewed clock signal that is substantially equivalent to the delayed version of the original clock signal and a skewed control signal generator adapted to generate a skewed control signal that is substantially equivalent to the delayed version of the original control signal. The data requestor further comprises an input sampling module for receiving the skewed clock signal and the skewed control signal and being adapted to sample, using the skewed clock signal and the skewed control signal, a data signal to obtain the requested data, wherein the data signal is representative of the requested data and is provided by the data source based at least in part on the delayed versions of the original clock signal and the original control signal.

In accordance with another embodiment of the present invention, an apparatus for synchronizing a data requestor with a data source during a provision of requested data is provided, the data requestor transmitting for reception by the data source an original control signal representative of a data request and an original clock signal and the data source receiving delayed versions of the original clock signal and the original control signal resulting from a delay in a signal path between the data requestor and the data source. The apparatus comprises an input sampling module having at least one input and being adapted to sample a data signal to obtain the requested data using a skewed clock signal substantially equivalent to the delayed version of the original clock signal and a skewed control signal that is substantially equivalent to the delayed version of the original control signal, wherein the data signal is representative of the requested data and is provided by the data source based at least in part on the delayed versions of the original clock signal and the original control signal. The input sampling module is further adapted to perform at least one process operation on the requested data based at least in part on process information associated with the requested data. The apparatus further comprises means for providing the process information to the input sampling module synchronously with the skewed clock signal and the skewed control signal.

In accordance with yet another embodiment of the present invention, a memory controller for obtaining stored data from a synchronous memory device is provided. The memory controller transmits for reception by the memory device a first clock signal and a first control signal representative of a data request and the memory device receives a delayed version of the first clock signal resulting from a delay in a clock signal path between the memory controller and the memory device and a delayed version of the first control signal resulting from a delay in a control signal path between the memory controller and the memory device. The memory controller comprises a clock signal skewing circuit for communicating the first clock signal over a clock signal skew path having a delay substantially equivalent to the delay of the clock signal path, whereby the clock signal skewing circuit delivers a second clock signal representative of the delayed version of the first clock signal and a control signal skewing circuit for communicating the first control signal over a control signal skew path having a delay substantially equivalent to the delay of the control signal path, whereby the control signal skewing circuit delivers a second control signal representative of the delayed version of the first control signal.

The memory controller further comprises a first dual clock FIFO buffer in electrical communication with the clock signal skewing circuit and being adapted to store, using the first clock signal, process information associated with the stored data, and output, using the second clock signal, the process information. The memory controller additionally comprises an input sampling module in electrical communication with the clock signal skewing circuit and the first dual clock FIFO buffer, the input sampling module being adapted to sample a data signal based at least in part on the second clock signal and the second control signal, wherein the data signal is representative of the stored data and is provided by the memory device based at least in part on the second clock signal and second control signal, obtain the process information from the first dual clock FIFO buffer based at least in part on the second clock signal and the second control signal, and perform at least one process operation on the stored data based at least in part on the process information.

In accordance with yet another embodiment of the present invention, a method for synchronizing a data requestor with a data source during a transfer of requested data is provided. The method comprises the steps of generating a skewed clock signal approximating a delayed version of an original clock signal communicated to the data source, the delayed version resulting at least in part from delay associated with a clock signal path over which the original clock signal is transmitted between the data requestor and the data source, and generating a skewed control signal approximating a delayed version of an original control signal communicated to the data source, the delayed version resulting at least in part from delay associated with a control signal path over which the original control signal is transmitted between the data requestor and the data source. The method further comprises the step of sampling, using the skewed clock signal and skewed control signal, a data signal received by the data requestor from the data source to obtain the requested data.

In accordance with an additional embodiment of the present invention, a method for synchronizing a memory controller with a synchronous memory device during a read access of stored data is provided. The method comprises the steps of sampling, using a second clock signal and a second control signal, a data signal provided by the memory device to obtain the stored data, the second clock signal being representative of a delayed version of a first clock signal received by the memory device from the memory controller and the second control signal being representative of a delayed version of a first control signal received by the memory device from the memory controller and obtaining, using the second clock signal, process information associated with the stored data from a first dual clock FIFO buffer. The method further comprises the step of performing at least one process operation on the stored data based at least in part on the process information.

In a digital subscriber line modem comprising a communications processor coupled to a synchronous memory device, the communications processor transmitting for reception by the memory device an original control signal representative of a data request and an original clock signal and the memory device receiving a delayed version of the original clock signal resulting from a delay in a clock signal path between the communications processor and the memory device and a delayed version of the original control signal resulting from a delay in a control signal path between the communications processor and the memory device, an apparatus for synchronizing an access of the requested data stored in the memory device is provided. The apparatus comprises means for generating a skewed clock signal substantially equivalent to the delayed version of the original clock signal and means for generating a skewed control signal substantially equivalent to the delayed version of the original control signal. The apparatus further comprises an input sampling module in electrical communication with the means for generating the skewed clock signal and the means for generating the skewed control signal and being adapted to sample, using the skewed clock signal and the skewed control signal, a data signal to obtain the requested data, wherein the data signal is representative of the requested data and is provided by the data source based at least in part on the delayed versions of the original clock signal and the original control signal.

One advantage of at least one embodiment of the present invention is improved reliability during the sampling of the data signals from a data source during a data access by minimizing the effects of skew between the requestor of the data and the source of the data. Another advantage includes allowing the use of synchronous memory devices using separate read and write clocks.

Still further features and advantages of the present invention are identified in the ensuing description, with reference to the drawings identified below.

BRIEF DESCRIPTION OF THE DRAWINGS

The purpose and advantages of the present invention will be apparent to those of ordinary skill in the art from the following detailed description in conjunction with the appended drawings in which like reference characters are used to indicate like elements, and in which.

DETAILED DESCRIPTION OF THE INVENTION

Figure 1:
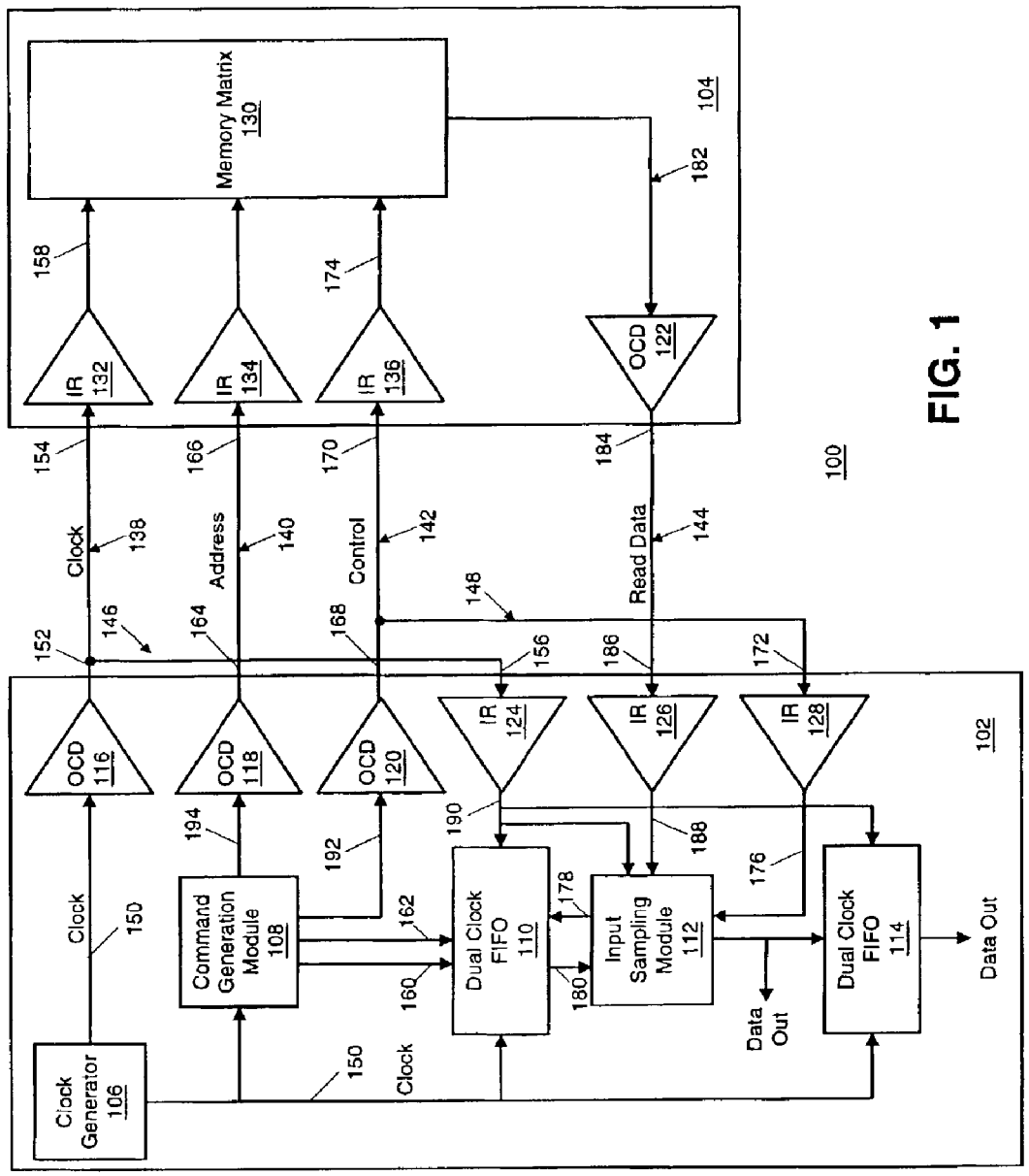
FIG. 1 is a schematic diagram illustrating an exemplary mechanism for compensating for signal skew at a synchronous memory device during a read access in accordance with at least one embodiment of the present invention.

The following description is intended to convey a thorough understanding of the present invention by providing a number of specific embodiments and details involving synchronized memory access. It is understood, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

FIGS. 1-4 illustrate mechanisms for improved synchronization during a data access from a synchronous data source. In at least one embodiment, a data requestor provides a common clock signal and a control signal to a data source, indicating a request for data from the data source. As a result of significant delays present in the signal paths between the data requestor and the data source, the reception of the common clock signal and the control signal are delayed during transmission, causing the timing of the output of the requested data from the data source to be unreliable. Accordingly, in at least one embodiment, the data requestor provides skewed clock and control signals to its input sampling module to compensate for the delay between the data requestor and the data source, where the skewed signals are substantially equivalent to the corresponding actual delayed signals received at the data source. Using these skewed clock and control signals, the data can be more reliably sampled. Additionally, in at least one embodiment, process information, which includes implementation-specific-information associated with the requested data (e.g., a destination address), is generated in the original clock domain but provided to the module handling the requested data in the skewed clock domain. In one embodiment, a dual clock FIFO is used to store the process information using the common clock and the process information can retrieved from the FIFO at the appropriate time using the skewed clock signal. In another embodiment, a signal path having a delay substantially similar to the control signal path and/or the clock signal path can be used to delay the process information so that it is synchronized with the skewed control signal.

Although the present invention may be implemented in any number of systems wherein a data requestor and a data source utilize a common clock to synchronize a transfer of requested data between the data source and the data requestor, the present invention finds particular benefit in systems implementing a memory controller (one embodiment of the data repuestor) and a synchronous memory device (one embodiment of the data source). While FIGS. 1-4 illustrate various implementations of a memory controller used to access stored data from a synchronous memory device in accordance with various embodiments of the present invention, these exemplary illustrated embodiments are not intended to limit the present invention to such implementations. Rather, the present invention may be implemented by those skilled in the art in a number of synchronous data access mechanisms, using the guidelines provided herein.

In the following discussion of FIGS. 1-4, reference is made to the timing, sampling, and transmission of digital signals between one or more electrical components. Those skilled in the art will appreciate that the successful transmission and reception of such signals often requires certain signal considerations, including set up times, hold times, and the like. However, for the ease of illustration, the following discussion disregards these widely known signal considerations. Mechanisms for coping with such signal considerations are well known and may be implemented by those skilled in the art, using the guidelines provided herein, without departing from the spirit or the scope of the present invention.

Referring now to FIG. 1, an exemplary memory access system 100 is illustrated in accordance with at least one embodiment of the present invention. In the illustrated embodiment, the memory access system 100 includes a data requestor adapted to request and obtain data from a data source. More particularly, the system 100 includes a memory controller 102 (i.e., the data requestor) connected to a synchronous memory device 104 (i.e., the data source). The memory controller 102 can serve any type of application, such as microprocessor system (personal computer, workstation, etc.), embedded systems, graphics and game systems and the like.

In the illustrated exemplary implementation, the memory controller 102 includes a clock generator 106, a command generation module 108, a dual clock FIFO 110, an input sampling module 112, off-chip drivers (OCDs) 116-120 and input receivers (IRs) 124-128. The memory device 104 can include any of a number of synchronous memory devices, including SDRAM, SSRAM, synchronous FLASH, synchronous FIFOs, programmable logic, etc., as well as other devices. In the illustrated embodiment, the memory device 104 includes a memory matrix 130, IRs 132-136, and an OCD 122.

As with known memory controllers, the memory controller 102 can be adapted to obtain stored data from the memory device 104 by providing an original clock signal 150 generated by the clock generator 106, an address signal 194 generated by the command generation module 108, and a control signal 192 (e.g., a read request) generated by the command generation module 108 and transmitted to the memory device 104 via interconnects 138, 140, and 142, respectively. In turn, the memory device 104 can be adapted to locate the stored data based at least in part on the address, control, and clock information and to provide the requested stored data to the memory controller 102 in the form of a data signal 182 transmitted via the data interconnect 144.

Rather than utilizing the original clock signal 150 to sample the data signal to extract the stored data, in at least one embodiment, a skewed clock signal 190 is provided to the input sampling module 112. The skewed clock signal 190, in at least one embodiment, has a skew relative to the original clock signal 150 that is substantially equivalent to the skew in the clock signal path (i.e., the OCD 116, the interconnect 138, and the IR 132) between the memory controller 102 and the memory device 104. In other words, the skewed clock signal 190, in this case, is intended to simulate or represent the delayed version of the clock signal 150 (i.e., skewed clock signal 158) as received by the memory matrix 130. Likewise, a skewed control signal 176 is provided via IR 128 to the input sampling module 112 for use in detecting a read request generated by the command generation module 108. Like the skewed clock signal 190, the skewed control signal 176 simulates the delayed version of the control signal 192 (i.e., the skewed control signal 174) received by the memory matrix 130 as a result of the transmission of the original control signal 192 over the control signal path (i.e., the OCD 120, the control interconnect 142, and the IR 136).

By using a skewed clock signal 190 that is substantially equivalent (i.e., substantially similar skew) to the delayed version of the original clock signal 150 (i.e., skewed clock signal 158) received by the memory matrix 130 and a skewed control signal 176 that is substantially equivalent to the delayed version of the original control signal 192 (i.e., skewed control signal 174) received by the memory matrix 130, the timing of the input sampling module 112 can be adjusted by an amount substantially equivalent to the delay of signal paths between the memory controller 102 and the memory device 104. As a result, the input sampling module 112 is more synchronized with the memory device 104 and therefore can more reliably sample the data signal from the memory device 104.

The only remaining potential delays of any significance typically include the $t_{OCD}$ of the OCD 122, the $t_{PCB}$ of the data interconnect 144, and the $t_{IR}$ of the IR 126. However, by shifting the clock signal and the control signal used by the input sampling module 112 by amounts substantially equivalent to the amounts of the skew introduced by the clock and control signal paths, respectively, the resulting overall skew can be reduced by a substantial amount, even in the presence of skew in the data signal path (i.e., the difference between the original data signal 182 and the skewed data signal 188 received by the input sampling module 112). For example, assuming that the delay of each OCD of the system 100 is the same, the delay of each IR is the same, and the delay of each interconnect is the same, then the total non-compensated skew during a read operation can be reduced by half since the skewed clock signal 190 and the skewed control signal 176, as used by the input sampling module 112, compensate for half of the sources of delay. Accordingly, the maximum frequency of the clock signal 150 (theoretically) can be increased twofold as a result of reduction by half in the skew, thereby allowing an increase in the read data rate by the memory controller 102. In the event that the sums of the delays introduced by clock and/or control signal paths are greater than the skew in the skewed data signal 188, the frequency of the clock signal 150 can be increased even further.

Any number of mechanisms may be implemented to provide a skewed clock signal 190 that simulates/represents the skewed clock signal 158 as received by the memory matrix 130, as well as a skewed control signal 176 that simulates/ represents the skewed control signal 174 as received by the memory matrix 130. In one embodiment, these representative skewed signals are generated by providing each original signal to the input sampling module 116 over a corresponding signal path that is substantially similar to the corresponding signal path between the memory controller 102 and the memory device 104. As illustrated, the original clock signal 150 is provided to the input sampling module 112 via a signal path having the OCD 116, an interconnect 146, and the IR 124. By comparison, the clock signal path to the memory device includes the OCD 116, the interconnect 138, and the IR 124. In the event that the interconnects 146, 138 have a similar delay and the IRs 124, 132 have a similar delay, then the delays of the original clock signal path and the simulated signal path to the input sampling module 116 are substantially equivalent. As such, the signal path from the OCD 116 through the IR 124 can be assumed to have a skew that is substantially equivalent to the signal path from the OCD 116 through the IR 132.

Similarly, the original control signal 192 can be provided from the command generation module 108 to the input sampling module 112 via a signal path that includes the OCD 118, an interconnect 148, and the IR 128, resulting in a skewed control signal 176 that simulates the skew of the original control signal 192 over the signal path having the OCD 120, the control interconnect 142, and the IR 136. Although one mechanism for providing a skewed clock and/or control signals that are substantially synchronized to corresponding delayed signals received at the memory device 104, those skilled in the art can develop other mechanisms using the guidelines provided herein.

Utilizing a clock signal and a control signal that simulate the skewed clock signal 158 and skewed control signal 174, respectively, to sample the input data signal 188 can minimize or eliminate the uncertainty in the timing of the sampling. However, as discussed above, the sampled data is sampled in the skewed clock domain rather than the original clock domain. Accordingly, the uncertainty may shift from the sampling of the data read signal to the processing of the sampled data.

To illustrate, assume that a first read request is initiated at the rising edge of a clock cycle (time $t_1$) of the original clock signal 150 when the command generation module 108 provides an address signal 194 representative of a memory location and a control signal 192 representative of a request to obtain a first set of data stored at the memory location to the memory device 104. Also assume that the memory access latency of the memory device 104 is predetermined to be one clock cycle of the original clock signal 150. Additionally, assume that a first location at which the requested first set of data is to be stored is provided to the input sampling module 112 sometime in the first clock cycle following the time $t_1$. Furthermore, in this example, a second read request is initiated at the rising edge of the next clock cycle (time $t_2$) using the same process for a different set of stored data. Sometime during the second clock cycle, a second location is provided for the second set of data.

In the absence of any skew, the input sampling module 112 can sample the data signal 182 from the memory device 104 (received via IR 126 as data signal 188) to obtain the first set of data at the rising edge of the second clock cycle (time $t_2$) Using the first location received sometime after $t_1$ and before $t_2$, the input sampling module 112 can route the first set of data to its intended storage location. Similarly, the input sampling module 112 can sample the data signal 188 at the rising edge of a third clock cycle (time $t_3$) to obtain the second set of data. Using the second location received from the command generation module 108 between time $t_2$ and time $t_3$, the input sampling module 112 can route the second set of data to the second storage location.

However, when the skewed clock signal 190 is used by the input sampling module 112 to sample the skewed data signal 188 from the memory device 104 to minimize the effects of clock skew, the first and second sets of data are sampled in the skewed clock domain rather than the original clock domain. As a result, it would be difficult if not impossible to determine which read request of the sequence of read requests is associated with each of the first and second sets of data. Accordingly, in at least one embodiment, the command generation module 108 is adapted to provide associated process information (represented by signal 160) to a dual clock first in-first out (FIFO) buffer 110, where the FIFO 110 acts as a buffer to the input sampling module 112. The process information can include any of a variety of implementation-specific information, such as the destination locations of data retrieved from the memory device 104, received data type (such as data/instruction), target host for the data, etc.

In at least one embodiment, a dual clock FIFO buffer 110 is used as an interface between the two different clock domains, whereby the FIFO input operations are synchronized to the original clock and the FIFO output operations are synchronized to the skewed clock. In at least one embodiment, the process information is written to the FIFO 110 synchronous to the original clock signal 150. This information is later read from the FIFO 110 synchronous to the skewed clock signal 190. As such, the FIFO 110 can be viewed as an interface between the original clock domain and the skewed clock domain for process information associated with data requested from the memory device 104.

By using the FIFO 110 to store one or more sets of process information for use by the input sampling module 112, a correlation between the read requests by the memory controller 102 and the resulting sets of sampled data can be maintained. In at least one embodiment, the command generation module 108 is adapted to generate process information when a read request is generated and transmitted. The process information associated with the read request (represented by signal 160) is then stored in the FIFO 110 using the original clock 150 and a write enable signal 162. Based at least in part on the skewed control signal 176 and the skewed clock signal 190, the input sampling module 112 can determine the appropriate time to extract the process information from the FIFO 110 for use in processing the corresponding data set from the memory device 104. When the input sampling module 112 detects a read request (control signal 176), the input sampling module 112 can send a read enable signal 178 to the FIFO 110, directing the FIFO 110 to output the next stored set of process information (represented by signal 180).

Since the sets of process information are extracted from the FIFO 110 synchronously with the sampling of the corresponding data by the input sampling module 112 (due to the skewed clock signal 190 and the skewed control signal 176), the input sampling module 112 can correctly associate read data with its corresponding process information. By using skewed clock and control signals via the IRs 124, 128 in conjunction with the dual clock FIFO 110, it will be appreciated that the input sampling module 112 can simulate the timing of the memory device 104 by using skewed signals that are substantially equivalent to the skewed signals received by the memory device 104. By simulating the timing, the input sampling module 112 can more reliably synchronize the sampling of the data signal provided by the memory device 104.

However, while using the skewed clock signal 190 to synchronize the input sampling module 112 and/or the dual clock FIFO 110 to the memory device 104, it will be appreciated that the data output from the input sampling module 112 is sampled in the skewed clock domain and therefore may cause difficulties when manipulated by other components of the memory controller 102 and/or other devices that are operating in the original clock domain (clock signal 150). Accordingly, in at least one embodiment, the memory controller 102 includes a second dual clock FIFO buffer 114 at the output of the input sampling module 112 to store output data (as well as any process information for used for subsequent processing with logic operating synchronous to the original clock). Just as the dual clock FIFO 110 can act as an interface to pass process information from the original clock domain to the skewed clock domain, the dual clock FIFO 114 can act as an interface to pass resulting data from the skewed clock domain to the original clock domain. In this case, the output of the input sampling module 112 is buffered in the FIFO 114 based in part on the skewed clock signal 190 while buffered data can be output from the FIFO 114 based in part on the original clock signal 150, thereby allowing components synchronized to the original clock signal 150 to properly utilize the output data from the input sampling module 112. It is also possible to construct a memory controller that would not require any process information. For example, if the memory controller serves only one host, and the host generates ordered requests and the memory controller does not change the order in which requests are handled, no process information is required at the controller. On the other hand, if this exemplary memory controller would change the order of read requests going to the memory, such FIFO to hold the re-ordering information (denoted here as process information) would be desirable.

Although one mechanism of synchronizing the transfer of process information from the command generation module 108 to the input sampling module 112 has been illustrated, those skilled in the art can develop other mechanisms, using the guidelines provided herein, without departing from the spirit or the scope of the present invention. For example, in one embodiment, the process information generated by the command generation module 108 is provided to the input sampling module 112 via a process signal path having a similar skew as the control signal path and/or the clock signal path. The skew of the control signal path/clock signal path could be simulated in the process signal path, for example, by transmitting the process information to the input sampling module 112 over a signal path having: an OCD having similar properties as the OCD 166 or OCD 120; an interconnect similar to the interconnect 144 or the interconnect 148; and an IR having similar properties as the IR 132 or IR 128. As a result, the process information delayed between the command generation module 108 and the input sampling module 112 by a similar amount of time as the clock and/or control signals over their respective signal paths. Accordingly, using the process signal path having a similar delay as the control/clock signal paths, the process information can be synchronized to the skewed control signal 176 and/or the skewed clock signal 190.

Figure 2:
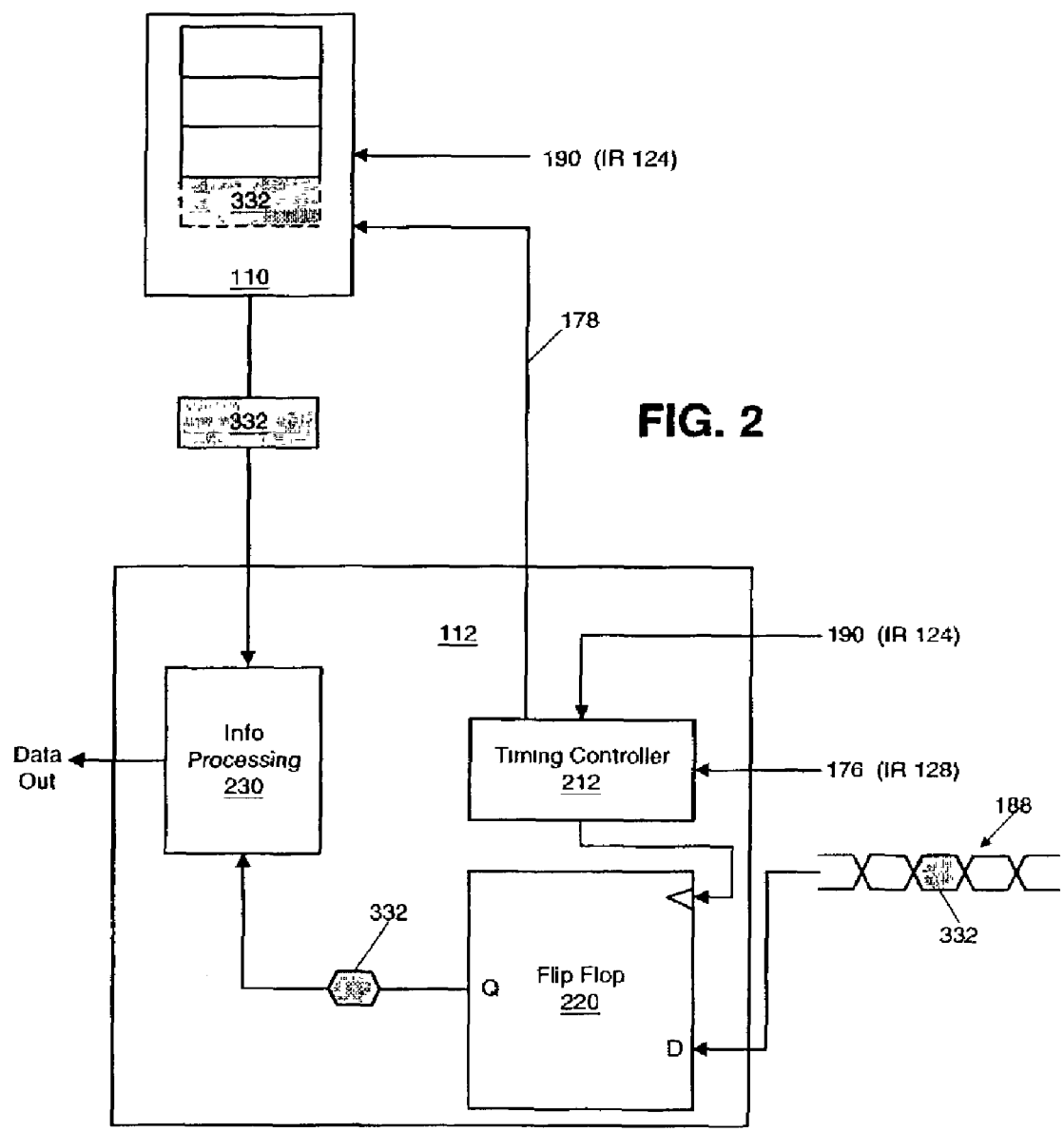
FIG. 2 is a schematic diagram illustrating the exemplary mechanism of FIG. 1 in greater detail in accordance with at least one embodiment of the present invention.
Figure 3:
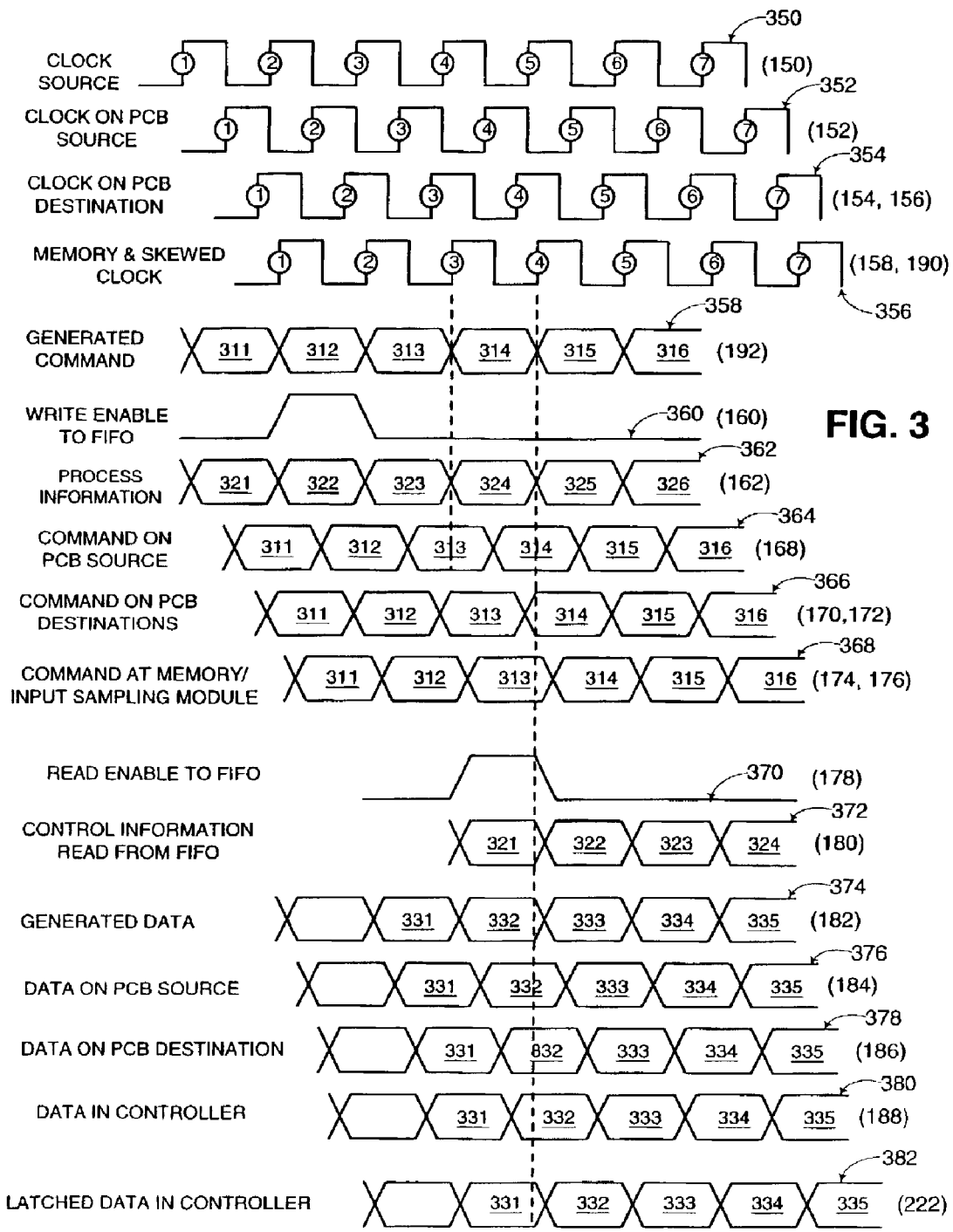
FIG. 3 is a timing diagram illustrating an exemplary operation of the mechanism of FIGS. 1 and 2 in accordance with at least one embodiment of the present invention.

Referring now to FIGS. 2 and 3, an exemplary operation of the system 100 is illustrated in accordance with at least one embodiment of the present invention. FIG. 2 illustrates an exemplary implementation of the input sampling module 112. In the illustrated embodiment, the input sampling module 112 includes a timing controller 212, a flip flop 220 for each data line of the data interconnect 144, and an information processing module 230. For ease of illustration, a single flip flop 220 corresponding to a single data line of the data interconnect 144 is shown in FIG. 2. The components of the input sampling module 112 can be implemented as software, firmware, hardware, or a combination thereof.

In at least one embodiment, the skewed clock signal 190 and the skewed control signal 176 are provided to the timing controller 212, whereupon the timing controller 212 is adapted to provide an enable signal to the flip flop 220 based at least in part on the skewed clock signal 190 and/or the skewed control signal 176. For example, assume that the memory access latency of the memory device 104 (FIG. 1) is one clock cycle. As such, the requested stored data can be made available on the data interconnect 144 (FIG. 1) by the memory device 104 one clock cycle after the memory device 104 receives a read request (as part of the skewed control signal 174). In this case, the timing controller 212 can be adapted to send an enable signal to the flip flop 220 one cycle after detecting a read request from the skewed control signal 176 to cause the flip flop 220 to latch the requested data on the data signal 188 at the appropriate time.

Because the skewed control signal 176 and the skewed clock signal 190 include delays that are, in one embodiment, substantially equivalent to the delays in the clock and control signals received by the memory device 104, the operation of the timing controller 212 may be substantially synchronized with the memory device 104. Due to this synchronization, the flip flop 220, upon receipt of the output enable signal from the timing controller 212, is able to more reliably sample the data signal 188 since the timing errors resulting from the skew between the memory controller 102 and the memory device 104 are substantially minimized or eliminated.

The information processing module 230, in at least one embodiment, is adapted to perform one or more processes on latched data retrieved from the memory device 104 based at least in part on the corresponding process information received from the FIFO 110. It will be appreciated that the process information and the operation(s) performed based at least in part on the process information are implementation-specific and, therefore, any of a variety of processes, or a combination thereof, may be implemented without departing from the spirit or the scope of the present invention. Such process operations can include routing the retrieved data to one or more destinations based on an associated destination address (one embodiment of the process information), decrypting the retrieved data based on an associated encryption key (another embodiment of the process information), and the like. Additionally, as discussed above with reference to FIG. 1, in one embodiment, the information processing module 230 can be adapted to provide its output to the dual clock FIFO 114 (FIG. 1) for storage using the skewed clock signal 190, whereupon the buffered data subsequently can be output to other components of the memory controller 102 using the original clock signal 150.

FIG. 3 is an exemplary timing diagram for illustrating a skew-compensated memory access process of system 100 (FIGS. 1 and 2) in accordance with at least one embodiment. In the following example, waveform 350 represents the original clock signal 150 generated by the clock generator 106 and provided to the interconnects 138, 146 via the OCD 116, which introduces a delay into the clock signal. The waveform 352 represents the skewed clock signal as output via the OCD 116 at point 152 of the interconnects 138, 146 and the waveform 345 represents the skewed clock signal as received at the input of the IR 132 (point 154) and the IR 124 (point 156), further including the delays resulting from the interconnects, such as PCB trace delays. Waveform 356 represents the skewed version of the original clock signal 150 as received by the memory matrix 130 (as skewed clock signal 158) and the input sampling module 112 (as skewed clock signal 190), where the delay between the original clock signal 150 (waveform 350) and the skewed clock signals 158, 190 (waveform 356) is a result of the delays introduced by the respective control signal paths. In this example, it is assumed that that the delay of each control signal path is the same.

In response to each of the rising edges of the original clock signal 150, the command generation module 108, in this example, generates a read request (commands 311-316) as part of the control signal 192 to direct the memory device 104 to output data located at the address of the memory matrix 130 provided by the memory controller 102 via the address signal 194. For illustrative purposes, the following discussion focuses on the access of data from the memory device 130 resulting from the second read request (command 312).

In addition to generating commands 311-316 and transmitting them to the memory device 104 via the command signal path, the command generation module 108, in one embodiment, generates and provides process information 321-326 (waveform 362) to the FIFO 110 and asserts the write enable signal 160 to direct the FIFO 110 to store the corresponding process information. To illustrate, the command generation module 108 generates process information 322 (e.g., a destination address) corresponding to the data requested by the command 312 and asserts the write enable signal 160 (waveform 360) at the second rising edge of the original clock signal 150 (waveform 350) to direct the FIFO 110 to store the process information 322.

Meanwhile, as the control signal 192 is transmitted across the control signal paths, delay is introduced by the IRs, interconnects, and OCDs of the paths. Waveform 364 represents the skewed version of the control signal 192 at the output of the OCD 118 (point 164), waveform 366 represents the skewed control signal at the inputs to the IRs 128, 136 (points 172, 170, respectively), and waveform 368 represents the skewed control signal as received by the memory matrix 130 (skewed control signal 174) and the input sampling module 112 (skewed control signal 176). As with the clock signal, it is assumed in this example that the skews of the control signal paths are the substantially equivalent.

Waveform 374 represents the data 331-335 output in sequence by the memory device 104 as part of data signal 182 in response to the commands 311-316 (waveform 368). In this example, it is assumed that the data is available from the memory device 104 one cycle after receipt of a read request (commands 311-336). Waveform 376 represents the delayed data signal resulting from the OCD 122 (point 184), waveform 378 represents the delayed data signal at the input to the IR 126 (point 186), and waveform 380 represents the skewed data signal 188 as received by the input sampling module 112.

Upon detecting the command 312 from the skewed control signal 176 at the input sampling module 112, the timing controller 212 asserts the read enable signal 178 (waveform 370) during the next cycle of the skewed clock signal 190 (the third rising edge to the fourth rising edge) to direct the FIFO 110 to output the next set of process information (process information 322). In the following cycle of the skewed clock signal 190, the process information 322 is output to the information processing module 230 for use in processing the requested data associated with the command 312 (data 332).

At approximately the same time that command 312 is detected by the timing controller 212, the memory matrix 130 detects the command 312 from the skewed signal 174 and places the data 332 requested by command 312 on the data signal path during the following cycle of the skewed clock signal 158. The timing device 212, expecting the data 332 associated with command 312 to be available at the fourth rising edge of the skewed clock signal 190, provides an enable signal to the flip flop 220 to sample the data signal 188 at the fourth rising edge of the skewed clock signal 158 to latch the data 332. By utilizing a skewed clock signal and a skewed control signal that is substantially similar to the skewed clock signal and skewed control signal, respectively, received at the memory matrix 130, the memory controller 102 can substantially compensate for the skew introduced by the signal paths. The resulting latched data 332 is then provided to the information processing module 230 for further processing.

In the exemplary implementation, the process information 322 includes a destination address for the data 332 and the information processing module 230 is adapted to route the data 332 retrieved from the memory device 104 to its appropriate destination based on the corresponding destination address. When data 332 and its associated destination address are received by the information processing module 230, the information processing module 230 determines the appropriate destination of the received data from the destination address and routes the data 332 to this destination as appropriate. Since, in at least one embodiment, the extraction of the destination address (as process information 322) and the sampling of the data 332 are synchronized based at least in part on the skewed control signal 176, as well as the skewed clock signal 190, there typically is little difficulty in matching a destination address value to its corresponding data retrieved from the memory device 104, and vice versa.

As the timing diagram of FIG. 3 illustrates, correctly sampling the skewed data signal 118 typically would prove impossible in the absence of the skewed control signal 176 used by the memory controller 102 to simulate the operation of the memory device 104. To demonstrate, if the timing controller 212 were to utilize the original control signal 192 in conjunction with the skewed clock signal 190, the timing controller 212 would detect either command 313 or 314 at the third rising edge of the skewed clock signal rather than command 312. As a result, the timing controller would improperly associate the data 332 sampled at the fourth rising edge with the command 313 or 314, rather than properly associating the data 332 with the command 312. Likewise, without a means for storing the process information, such as FIFO 110, the memory controller 102 typically would be unable to properly associate process information 322 with the data 332. To illustrate, the process information 322 is generated after the second rising edge of the original clock source 150 (waveform 340), but the data 332 associated with the process information is not latched by the input sampling module 112 (waveform 382) until around the fifth rising edge of the original clock signal 150. Accordingly, without the FIFO 110 or other similar mechanism to store the process information 322 until the associated data 332 is latched, the information processing module 230 would be unable to properly associate the process information 322 with the latched data 332.

Figure 4:
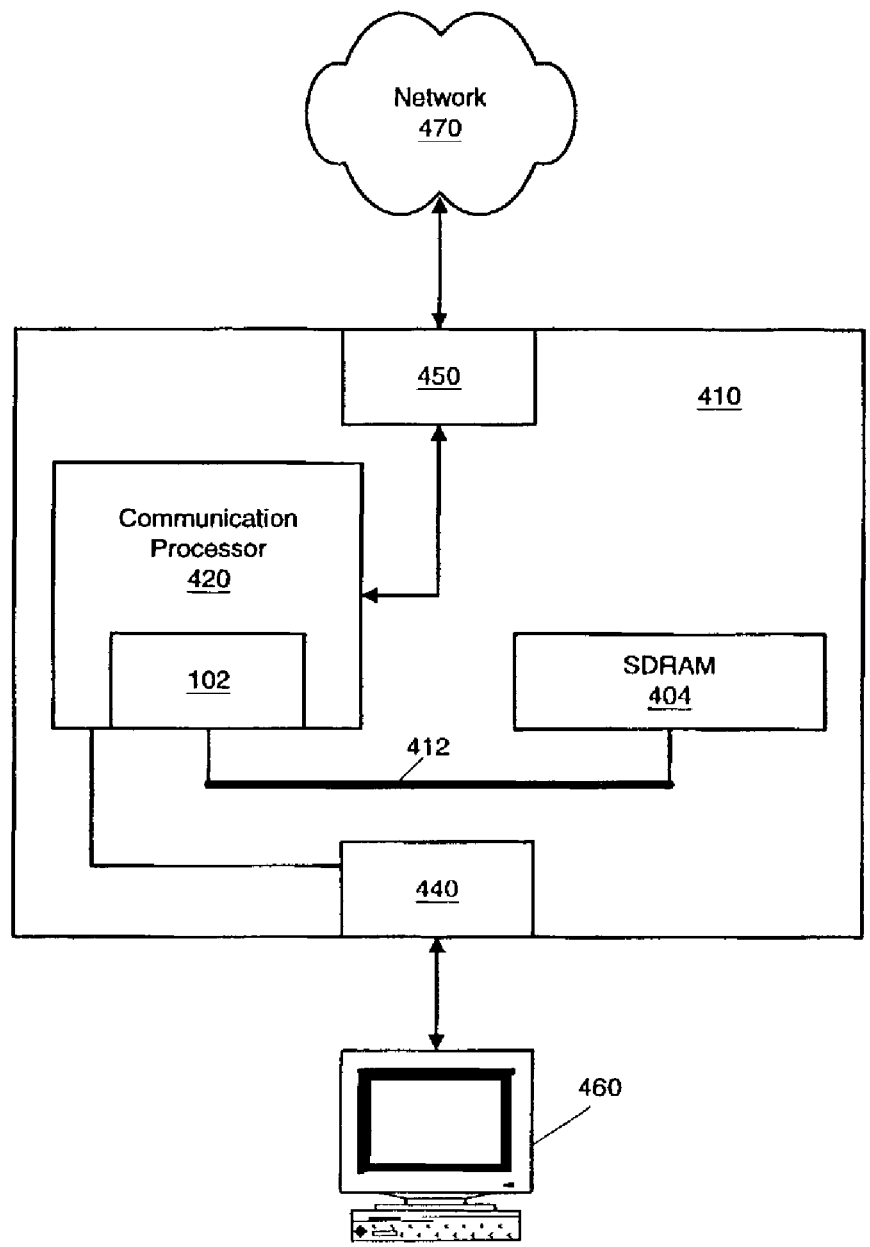
FIG. 4 is a schematic diagram illustrating an exemplary implementation of a memory controller in a digital subscriber line modem in accordance with at least one embodiment of the present invention.

Referring now to FIG. 4, an exemplary implementation of the memory controller 102 in a digital subscriber line (xDSL) modem 410 is illustrated in accordance with at least one embodiment of the present invention. As noted above, the present invention may be implemented in a number of different devices and systems that access data from a synchronous data source. Particularly, in one embodiment, the present invention can be implemented to access data from a synchronous dynamic random access memory (SDRAM) 404 for use by a communications processor 420 implemented by the DSL modem 410 for processing of data provided to, and received from, a network 470 (e.g., the Internet). The communications processor 420 can include any of a variety of communications processors, such as, for example, a communications processor available under the trade name Helium 200 from GlobespanVirata, Inc. of Red Bank, N.J. In the illustrated embodiment, data provided to the DSL modem 410 from one or more network devices 460 (e.g., a personal computer) is received by a network interface 440 (e.g., an Ethernet interface), transferred to the communication processor 420 and then stored in the SDRAM 404 for subsequent retrieval by the communications processor 420. When the data is to be retrieved from the SDRAM 404 for processing by the communications processor 420, the communications processor 420 utilizes the memory controller 102 to synchronously retrieve the data from the SDRAM 404. As discussed above with reference to FIGS. 1-3, the memory controller 102, in at least one embodiment, simulates the skew in the signal path 412 between the memory controller 102 and the SDRAM 404 to determine the appropriate timing for sampling of the data signal provided by the SDRAM 404. As such, the memory controller 102 can significantly improve the reliability of the sampled data without requiring the use of a slower system clock by the communications processor 420, thereby allowing the communications processor to operate at higher speeds.

Other embodiments, uses, and advantages of the invention will be apparent to those skilled in the art from consideration of the specification and practice of the invention disclosed herein. The specification and drawings should be considered exemplary only, and the scope of the invention is accordingly intended to be limited only by the following claims and equivalents thereof.

What is claimed is:

1. A data requestor for obtaining requested data from a synchronous data source, the data requestor transmitting for reception by the data source an original clock signal and an original control signal, which is representative of a data request, the data source receiving a delayed version of the original clock signal resulting from a delay in a clock signal path between the data requestor and the data source and a delayed version of the original control signal resulting from a delay in a control signal path between the data requestor and the data source, the data requestor comprising:
   a skewed clock signal generator adapted to generate a skewed clock signal that is substantially equivalent to the delayed version of the original clock signal, wherein the skewed clock signal generator includes means for transmitting the original clock signal for reception by the input sampling module over a signal path having a delay that is substantially equivalent to the delay of the clock signal path;
   a skewed control signal generator adapted to generate a skewed control signal that is substantially equivalent to the delayed version of the original control signal; and
   an input sampling module receiving the skewed clock signal and the skewed control signal and being adapted to sample, using the skewed clock signal and the skewed control signal, a data signal to obtain the requested data, wherein the data signal is representative of the requested data and is provided by the data source based at least in part on the delayed versions of the original clock signal and the original control signal.

2. The data requestor of claim 1, wherein the input sampling module is further adapted to perform at least one process operation on the requested data based at least in part on process information associated with the requested data.

3. The data requestor of claim 2, wherein the process information includes one of a group consisting of: a destination of the requested data, a representation of a data type, and reordering information.

4. The data requestor of claim 2, wherein the process information includes a destination of the requested data and the process operation includes providing the requested data to the destination.

5. The data requestor of claim 2, wherein the process information includes a decryption key and the process operation includes decrypting the requested data using the decryption key.

6. The data requestor of claim 2, further comprising means for providing the process information to the input sampling module synchronously with the skewed clock signal and the skewed control signal.

7. The data requestor of claim 6, wherein the means for providing the process information includes a first dual clock first in-first out (FIFO) buffer in electrical communication with the input sampling module and being adapted to: store, using the original clock signal, the process information; and output, using the skewed clock-signal, the process information to the input sampling module.

8. The data requestor of claim 6, wherein the means for providing the process information include means for providing the process information to the input sampling module over a process signal path having a delay substantially equivalent to the delay of the clock signal path.

9. The data requestor of claim 1, wherein the skewed control signal generator includes means for providing the original control signal to the input sampling module over a signal path having a delay that is substantially equivalent to the delay of the control signal path.

10. The data requestor of claim 1, further comprising a dual clock FIFO buffer in electrical communication with the input sampling module and being adapted to: store, using the skewed clock signal, the requested data sampled by the input sampling module; and provide, using the original clock signal, the requested data to at least one component of the data requestor.

11. The data requestor of claim 1, wherein the data requestor is a memory controller and the data source is a synchronous memory device.

12. An apparatus for synchronizing a data requestor with a data source during a provision of requested data, the data requestor transmitting for reception by the data source an original control signal representative of a data request and an original clock signal and the data source receiving delayed versions of the original clock signal and the original control signal resulting from a delay in a signal path between the data requestor and the data source, the apparatus comprising:
an input sampling module having at least one input and being adapted to:
sample a data signal to obtain the requested data using a skewed clock signal substantially equivalent to the delayed version of the original clock signal and a skewed control signal that is substantially equivalent to the delayed version of the original control signal, wherein the data signal is representative of the requested data and is provided by the data source based at least in part on the delayed versions of the original clock signal and the original control signal; and
perform at least one process operation on the requested data based at least in part on process information associated with the requested data; and
means for providing the process information to the input sampling module synchronously with the skewed clock signal and the skewed control signal, wherein the means for providing the process information includes a dual clock FIFO buffer in electrical communication with the input sampling module and being adapted to:
store, using the original clock signal, the process information; and
output, using the skewed clock signal, the process information to the input sampling module.

13. The apparatus of claim 12, further comprising a clock signal skewing circuit adapted to deliver the skewed clock signal for input to the dual clock FIFO buffer and the input sampling module.

14. The apparatus of claim 13, wherein the clock signal skewing circuit communicates the original clock signal to the dual clock FIFO buffer and the input sampling module over a signal path having a delay that is substantially equivalent to the delay of the signal path between the data requestor and the data source, resulting in the skewed clock signal.

15. The apparatus of claim 12, wherein the process information is communicated to the input sampling module over a signal path having a delay substantially equivalent to the delay between the data requestor and the signal path.

16. The apparatus of claim 12, further comprising a control signal skewing circuit adapted to provide a skewed control signal to the input sampling module.

17. The apparatus of claim 16, wherein the control signal skewing circuit communicates the original control signal to the input sampling module over a signal path having a delay that is substantially equivalent to the delay of the signal path between the data requestor and the data source.

18. The apparatus of claim 12, further comprising a dual clock FIFO buffer in electrical communication with the input sampling module and being adapted to: store, using the skewed clock signal, the requested data sampled by the input sampling module; and provide, using the original clock signal, the output data to at least one component of the data requestor.

19. The apparatus of claim 12, wherein the process information includes one of a group consisting of: a destination of the requested data, a representation of a data type, and reordering information.

20. The apparatus of claim 12, wherein the process information includes a destination of the requested data and the process operation includes providing the requested data to the destination.

21. The apparatus of claim 12, wherein the process information includes a decryption key and the process operation includes decrypting the requested data using the decryption key.

22. The apparatus of claim 12, wherein the data requestor is a memory controller and the data source is at least one synchronous memory device.

23. A memory controller for obtaining stored data from a synchronous memory device, the memory controller transmitting for reception by the memory device a first clock signal and a first control signal representative of a data request, the memory device receiving a delayed version of the first clock signal resulting from a delay in a clock signal path between the memory controller and the memory device and a delayed version of the first control signal resulting from a delay in a control signal path between the memory controller and the memory device, the memory controller comprising:
clock signal skewing circuit for communicating the first clock signal over a clock signal skew path having a delay substantially equivalent to the delay of the clock signal path, whereby the clock signal skewing circuit delivers a second clock signal representative of the delayed version of the first clock signal;
a control signal skewing circuit for communicating the first control signal over a control signal skew path having a delay substantially equivalent to the delay of the control signal path, whereby the control signal skewing circuit delivers a second control signal representative of the delayed version of the first control signal;
a first dual clock FIFO buffer in electrical communication with the clock signal skewing circuit and being adapted to: store, using the first clock signal, process information associated with the stored data; and output, using the second clock signal, the process information; and
an input sampling module in electrical communication with the clock signal skewing circuit and the first dual clock FIFO buffer, the input sampling module being adapted to:
sample a data signal based at least in part on the second clock signal and the second control signal, wherein the data signal is representative of the stored data and is provided by the memory device based at least in part on the second clock signal and second control signal;

obtain the process information from the first dual clock FIFO buffer based at least in part on the second clock signal and the second control signal; and perform at least one process operation on the stored data based at least in part on the process information.

24. The memory controller of claim 23, further comprising a second dual clock FIFO buffer in electrical communication with the input sampling module and being adapted to: store, using the skewed clock signal, the stored data sampled by the input sampling module; and provide, using the original clock signal, the stored data to at least one component of the memory controller.

25. The memory controller of claim 23, wherein the process information includes one of a group consisting of: a destination of the stored data, a representation of a data type, and reordering information.

26. The memory controller of claim 23, wherein the process information includes a destination of the stored data and the process operation includes providing the stored data to the destination.

27. The memory controller of claim 23, wherein the synchronous memory device includes one of a group consisting of: SDRAM, SSRAM, a synchronous FIFO, and programmable logic.

28. A method for synchronizing a data requestor with a data source during a transfer of requested data, the method comprising the steps of:

generating a skewed clock signal approximating a delayed version of an original clock signal communicated to the data source, the delayed version resulting at least in part from delay associated with a clock signal path over which the original clock signal is transmitted between the data requestor and the data source;

generating a skewed control signal approximating a delayed version of an original control signal communicated to the data source, the delayed version resulting at least in part from delay associated with a control signal path over which the original control signal is transmitted between the data requestor and the data source, wherein the step of generating the skewed control signal includes transmitting the original control signal over a signal path having a delay that is substantially equivalent to a delay over a control signal path used to transmit the original control signal from the data requestor to the data source; and sampling, using the skewed clock signal and skewed control signal, a data signal received by the data requestor from the data source to obtain the requested data.

29. The method of claim 28, further comprising the steps of: obtaining, using the skewed clock signal, process information associated with the requested data; and performing, at the data requestor, at least one process operation on the requested data based at least in part on the process information.

30. The method of claim 29, wherein the process information includes one of a group consisting of: a destination of the stored data, a representation of a data type, and reordering information.

31. The method of claim 29, wherein the process information includes a destination of the stored data and the step of performing the at least one process operation includes providing the stored data to the destination.

32. The method of claim 29, further comprising the step of storing, using the original clock signal, the process information in a dual clock FIFO buffer.

33. The method of claim 32, wherein the step of obtaining the process information includes obtaining the process information from the dual clock FIFO buffer using the skewed clock signal and the skewed control signal.

34. The method of claim 29, wherein the step of obtaining the process information includes transmitting the process information over a signal path having a delay substantially equivalent to a delay between the original clock signal and the delayed version of the original clock signal.

35. The method of claim 28, wherein the step of generating the skewed clock signal includes transmitting the original clock signal over a signal path having a delay that is substantially equivalent to a delay over a clock signal path used to transmit the original clock signal from the data requestor to the data source.

36. The method of claim 28, further comprising the step of storing, using the skewed clock signal, the requested data in a dual clock FIFO buffer.

37. The method of claim 36, further comprising the step of retrieving, using the original clock signal, the stored data from the dual clock FIFO buffer.

38. A method for synchronizing a memory controller with a synchronous memory device during a read access of stored data, the method comprising the steps of:

sampling, using a second clock signal and a second control signal, a data signal provided by the memory device to obtain the stored data, the second clock signal being representative of a delayed version of a first clock signal received by the memory device from the memory controller and the second control signal being representative of a delayed version of a first control signal received by the memory device from the memory controller;

obtaining, using the second clock signal, process information associated with the stored data from a first dual clock FIFO buffer; and performing at least one process operation on the stored data based at least in part on the process information; and generating the second clock signal from the first clock signal; and generating the second control signal from the first control signal.

39. The method of claim 38, further comprising the step of storing, using the first clock signal, the process information in the first dual clock FIFO buffer.

40. The method of claim 39, further comprising the step of generating the process information.

41. The method of claim 38, wherein the step of generating the second clock signal includes transmitting the first clock signal over a signal path having a delay that is substantially equivalent to a delay over a clock signal path used to transmit the first clock signal from memory controller to the synchronous memory device.

42. The method of claim 41, wherein the step of generating the second control signal includes transmitting the first control signal over a signal path having a delay that is substantially equivalent to a delay over a control signal path used to transmit the first control signal from the memory controller to the synchronous memory device.

43. The method of claim 38, further comprising the step of storing, using the second clock signal, the stored data in a second FIFO buffer.

44. The method of claim 43, further comprising the step of retrieving, using the first clock signal, the stored data from the second FIFO buffer.

45. The method of claim 38, wherein the process information includes one of a group consisting of: a destination of the stored data, a representation of a data type, and reordering information.

46. The method of claim 38, wherein the process information includes a destination of the stored data and the step of performing the at least one process operation includes providing the stored data to the destination.

47. The method of claim 38, wherein the process information includes a decryption key and the step of performing the at least one process operation includes decrypting the stored data using the decryption key.

48. In a digital subscriber line modem comprising a communications processor coupled to a synchronous memory device, the communications processor transmitting for reception by the memory device an original control signal representative of a data request and an original clock signal and the memory device receiving a delayed version of the original clock signal resulting from a delay in a clock signal path between the communications processor and the memory device and a delayed version of the original control signal resulting from a delay in a control signal path between the communications processor and the memory device, an apparatus for synchronizing an access of the requested data stored in the memory device comprising:

- means for generating a skewed clock signal substantially equivalent to the delayed version of the original clock signal, wherein means for generating a skewed clock signal includes means for transmitting the original clock signal for reception by the input sampling module over a signal path having a delay that is substantially equivalent to the delay of the clock signal path;
- means for generating a skewed control signal substantially equivalent to the delayed version of the original control signal; and
- an input sampling module in electrical communication with the means for generating the skewed clock signal and the means for generating the skewed control signal and being adapted to sample, using the skewed clock signal and the skewed control signal, a data signal to obtain the requested data, wherein the data signal is representative of the requested data and is provided by the data source based at least in part on the delayed versions of the original clock signal and the original control signal.

* * * * *